United States Patent [19]

Kasahara

[11] Patent Number: 5,340,998
[45] Date of Patent: Aug. 23, 1994

[54] SEMICONDUCTOR SURFACE LIGHT EMITTING AND RECEIVING HETEROJUNCTION DEVICE

[75] Inventor: Kenichi Kasahara, Tokyo, Japan
[73] Assignee: NEC Corporation, Tokyo, Japan
[21] Appl. No.: 843,212
[22] Filed: Feb. 28, 1992

[30] Foreign Application Priority Data

Feb. 28, 1991 [JP] Japan ............... 3-034754

[51] Int. Cl.$^5$ ............... H01L 33/00
[52] U.S. Cl. ............... 257/13; 257/21;
257/96; 257/97; 372/50; 372/46; 359/248
[58] Field of Search ............... 257/85, 84, 94, 95,
257/96, 97, 13, 21; 372/50, 45, 43, 46; 359/248,
263, 261, 238, 302

[56] References Cited

U.S. PATENT DOCUMENTS

| 3,979,587 | 9/1976 | de Cremoux | 257/85 |
|---|---|---|---|
| 4,202,000 | 5/1980 | Carballes | 257/85 |
| 4,216,485 | 8/1980 | Page | 257/85 X |
| 4,450,567 | 5/1984 | Scifres et al. | 257/85 X |
| 4,819,048 | 4/1989 | Mand et al. | 372/50 X |
| 5,038,356 | 8/1991 | Botez et al. | 372/45 |
| 5,055,893 | 10/1991 | Sasagawa | 372/46 X |
| 5,063,569 | 11/1991 | Xie | 372/45 |
| 5,068,868 | 11/1991 | Deppe et al. | 372/46 X |
| 5,068,870 | 11/1991 | Yagi et al. | 372/50 |
| 5,107,307 | 4/1992 | Onose et al. | 257/85 |

FOREIGN PATENT DOCUMENTS

| 63-200131 | 8/1988 | Japan | 359/248 |
|---|---|---|---|
| 64-14963 | 1/1989 | Japan | |

OTHER PUBLICATIONS

Applied Physics Letters, vol. 52, No. 9, Feb. 29, 1988, pp. 679–681, K. Kasahara et al, "Double heterostructure optoelectronic switch as a dynamic memory with low-power consumption".

Applied Physics Letters, vol. 57, No. 18, Oct. 29, 1990, pp. 1855–1857, B. Tell et al, "High-power cw vertical-cavity top surface-emitting GaAs quantum well lasers".

*Primary Examiner*—William Mintel
*Attorney, Agent, or Firm*—Sughrue, Mion, Zinn, Macpeak & Seas

[57] ABSTRACT

A surface-normal optoelectronic device is provided which includes a first semiconductor layer of a first electroconductive type, a second semiconductor layer of a second electroconductive type having a polarity inverse to that of the first electroconductive type, a semiconductor active layer, a third semiconductor layer of the first electroconductive type, and a fourth semiconductor layer of the second electroconductive type, formed on a semiconductor substrate. The second and third layers are larger in forbidden band width than the active layer, said second layer is smaller in forbidden band width than a part of the first layer contacting the second layer, and the third layer is smaller in forbidden band width than a part of the fourth layer contacting the third layer. High resistance regions are formed vertically passing through the active layer, to surround its light-emitting region and to have a resistance higher than that of that region. By providing such high resistance regions, an ineffective current to be drained out of the light emitting region can be outstandingly reduced. By setting the forbidden band widths as noted, carriers and light can be easily confined. Preferably, the first and fourth layers include layers serving as a reflecting mirror, the active layer being sandwiched by these layers. Laser emission is thereby rendered possible.

21 Claims, 4 Drawing Sheets

FIG.2

LIGHT

SEMICONDUCTOR SURFACE LIGHT EMITTING AND RECEIVING HETEROJUNCTION DEVICE

BACKGROUND OF THE INVENTION

1. Field of the Invention

This invention relates to a surface-normal optoelectronic device to be used for highly parallel optical transmission and optical information processing or the like.

2. Description of the Prior Art

Such a surface-normal optoelectronic device that the input and output of light can be made in the direction perpendicular to the surface of a semiconductor substrate and that possesses a latch function is an indispensable key device to be used for computer-to-computer data transmission and optical computing. A conventional surface-normal optoelectronic device is cross-sectionally shown in FIG. 1. This device is disclosed in the Japanese Laid-Open Patent Publication No. 64-14963.

Figure 1:
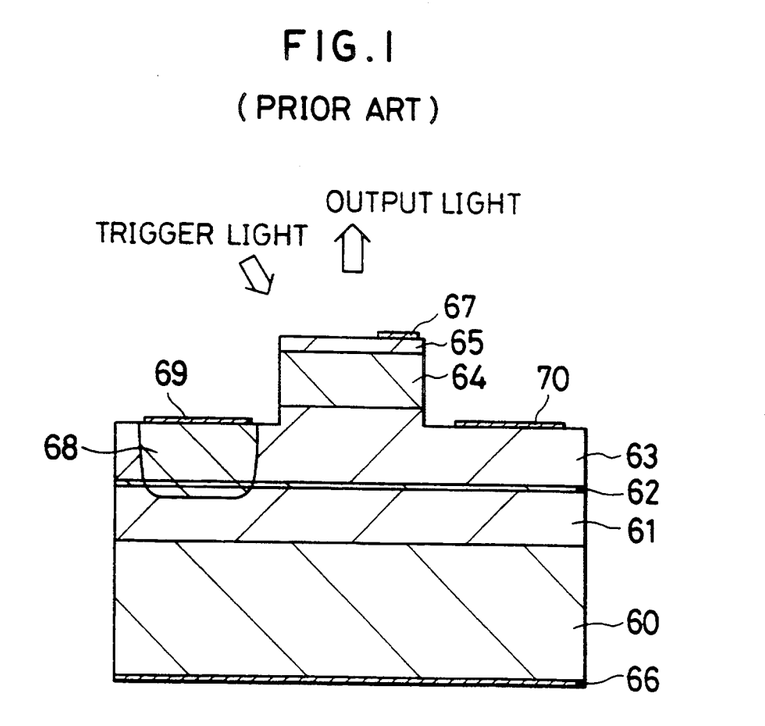
FIG. 1 is a cross-sectional view of a conventional surface-normal optoelectronic device.

The conventional surface-normal optoelectronic device shown in FIG. 1 has a so-called pnpn structure, in which on an n-type GaAs substrate 60, an n-type AlGaAs layer 61 (Al composition ratio 0.4; layer thickness 1 $\mu$m; doping concentration of donor $1\times10^{18}\text{cm}^{-3}$), a p-type GaAs layer 62 (layer thickness 50 Å; doping concentration of acceptor $1\times10^{19}\text{cm}^{-3}$), an n-type GaAs layer 63 (layer thickness 1 $\mu$m; doping concentration of donor $1\times10^{17}\text{cm}^{-3}$), a p-type AlGaAs layer 64 (Al composition ratio 0.4; layer thickness 0.5 $\mu$m; doping concentration of acceptor $1\times10^{18}\text{cm}^{-3}$), and a p-type GaAs layer 65 (layer thickness 0.15 $\mu$m; doping concentration of acceptor $1\times10^{19}\text{cm}^{-3}$) are laminatedly formed in this order. The n-type GaAs layer 60 and n-type AlGaAs layer 61 constitute a cathode region, the p-type GaAs layer 62 constitutes a p-type gate region, the n-type GaAs layer 63 constitutes an n-type gate region, the p-type AlGaAs layer 64 constitutes an anode region, and the p-type GaAs layer 65 constitutes a contact layer.

The GaAs substrate 60 has a cathode electrode 66 of an AuGe—Ni alloy formed on the lower surface opposite to the surface on which the n-type AlGaAs layer 61 is formed, and on the upper surface of the p-type GaAs layer 65, an anode electrode 67 of an Au—Cr—AuZn alloy is formed. In addition, a p-type diffusion region 68 is provided so as to pass from the upper surface of the n-type GaAs layer 63 through the n-type GaAs layer 63 and p-type GaAs layer 62 to the n-type AlGaAs layer 61. In the area just above the p-type diffusion region 68 on the upper surface of the n-type GaAs layer 63, an n-type gate electrode 69 of an Au—Cr—AuZn alloy is formed, and a p-type gate electrode 70 of an AuGe—Ni alloy is formed on the upper surface of the n-type GaAs layer 63 on the opposite side to the n-type gate electrode 69 with respect to a mesa portion formed on the surface of the n-type GaAs layer 63.

In case of using the above-mentioned conventional surface-normal optoelectronic device, a bias voltage is applied between the anode and cathode electrodes 67 and 66 so as to make the anode electrode 67 positive and the cathode electrode 66 negative, and the value of this bias voltage is set to a value just before the device is turned on. At this time, a voltage is not applied to the n-type gate electrode 69 and p-type gate electrode 70. Next, when a trigger light is applied to the n-type gate electrode 69 or the p-type gate electrode 70, the device is turned on to emit light as shown in FIG. 1. When once turned on, it is maintained even if the trigger light is stopped being applied. In this case, if the p-type AlGaAs layer 64 constituting the anode region, n-type AlGaAs layer 61 constituting the cathode region and n-type GaAs substrate 60 are made larger in forbidden band width than the p-type GaAs layer 62 constituting the p-type gate electrode and n-type GaAs layer 63 constituting the n-type gate electrode, carriers are confined into these gate regions, resulting in an enhancement in luminous efficiency. In order to turn it off, the polarity of the bias voltage applied to the anode electrode 67 and the cathode electrode 66 is reversed, and further, a voltage is applied so as to make the n-type gate electrode 66 positive and the p-type gate electrode 70 negative. As a result, the carriers confined into these gate regions shown above are forcibly taken out of the device, so that it is turned off. This means that high speed turn-off operation becomes possible.

With the conventional surface-normal optoelectronic device as shown in FIG. 1, light emission occurs in the light emitting diode (LED) mode under the turned-on condition, but it is unsatisfactory in its electro-optic conversion efficiency. In addition, the turn-off time is as large as several hundreds psec, so that more rapid response time is desirable. Further, because the gate electrodes 69 and 70 are provided, an electric current flows expandingly not only through a range corresponding to a light emitting portion (mesa portion) of the p-type GaAs layer 62 as an active layer but also through a range outside of this range, which means that satisfactory luminous efficiency cannot be obtained. Also, the spontaneous emission mode has a limitation upon frequency characteristic, thus rendering it impossible to operate at high speed.

Therefore, an object of this invention is to provide a surface-normal optoelectronic device which makes it possible to perform turn-on and turn-off operations at higher speed than would be provided by the above-described conventional surface-normal optoelectronic device as well as to obtain higher luminous efficiency.

Another object of this invention is to provide a surface-normal optoelectronic device which is operable in a laser diode (LD) mode superior in electro-optic conversion efficiency.

SUMMARY OF THE INVENTION (1) In a first aspect, a surface-normal optoelectronic device of this invention has a first semiconductor layer of a first electroconductive type, a second semiconductor layer of a second electroconductive type opposite in polarity to said first electroconductive type, a semiconductor active layer, a third semiconductor layer of the first electroconductive type, and a fourth semiconductor layer of the second electroconductive type formed on the surface of a semiconductor substrate in this order. Said second layer and third layer are larger in forbidden band width than said active layer, said second layer is smaller in forbidden band width than a part of said first layer which is in contact with said second layer, and said third layer is smaller in forbidden band width than a part of said fourth layer which is in contact with said third layer. A high resistance region/regions is/are formed vertically passing through said active layer so as to surround its light emitting region, which has an electric resistance higher than that of the light emitting range. In addition, the first electroconductive type means one of the n-type and p-type of semiconductor, and the second electroconductive type means the other.

In this device, the active layer is provided between the second and third layers and the high resistance region/regions is/are formed vertically passing through the active layer so as to surround its light emitting region, so that an ineffective current to be drained out of the light emitting region can be extremely reduced, resulting in an improvement in luminous efficiency. In addition, there is no excess pn junction around the light emitting region, and a parasitic capacity becomes small, so that it can be operated at higher speed. Further, the gate electrodes can be formed without expanding the area of the active layer. Still further, said high resistance region/regions can be realized, for example, by selectively implanting ions into said third layer in the direction perpendicular to the third layer.

In this device, it is preferable that the first layer and fourth layer respectively function as a reflecting mirror.. In this case, in addition, it is preferable that the sum of the thicknesses of the semiconductor layers (that is, second layer, third layer and active layer) provided between the first and fourth layers is an integral multiple of the in-medium wavelength of emitted light from the active layer. As a result, this device makes it possible to effect a laser emission under the turn-on condition. In this case, since an ineffective current can be extremely reduced, it makes it possible to effect the LD operation without increasing the threshold current density. The LD mode is superior in electro optic converting efficiency, switch-off speed, frequency characteristic and directivity of an emitted light beam to the LED mode, which means that the device of this invention can be made further superior in various characteristics to conventional ones. As the first or fourth layer function as a reflecting mirror, a multilayer film (of p-type or n-type) made, for example, of GaAs films and AlAs films alternately laminated can be used.

It is preferable that a surface of the third layer is partially exposed from the fourth layer to form the first and second gate electrodes on the surface thus exposed, and the high resistance regions are respectively placed under these gate electrodes.

The cathode electrode is connected to the first layer or fourth layer according to the electroconductive type, but it may be connected directly to the first layer or fourth layer or to the contact layer formed adjacently to the first or fourth layer. The anode electrode is similar to the above. The electrode to be connected to the first layer may be connected to the substrate, in this case, however, it is preferable to form a contact layer between the substrate and the first layer for connecting the electrode to the contact layer thus formed. This is because the electrodes are possibly formed only on one side of the substrate.

(2) In a second aspect, a surface-normal optoelectronic device of this invention it has a four-layer structure which is obtained by excepting the active layer from the device shown in the first aspect The second layer and third layer are smaller in forbidden band width than the first layer or fourth layer, and high resistance region/regions is/are provided at the vicinity of the junction of the second and third layers so as to surround its light emitting region and have an electric resistance higher than that of the light emitting region.

In this device, similar to that of the first aspect, it is preferable that a surface of the third layer is partially exposed from the fourth layer to form the first and second gate electrodes on the surface thus exposed, and the high resistance regions are placed under these gate electrodes.

In this device, there is no active layer and the LD operation is not effected, however, the light emitting region is narrowed by the high resistance region/regions similar to the case in the first aspect, so that an electric current can be injected highly efficiently, resulting in obtaining a higher light output. In addition, there is no excess parasitic capacity due to a pn junction around the light emitting region, so that high speed response becomes possible, resulting in an improvement in turn-off speed, for example, to several tens psec.

BRIEF DESCRIPTION OF THE DRAWINGS

FIGS. 3 to 5 are for explaining a production method of the device as shown in FIG. 2 on a processing basis in which;

DESCRIPTION OF THE PREFERRED EMBODIMENTS

Preferred embodiments of this invention will be described below while referring to FIGS. 2 to 6.

First Embodiment

Figure 2:
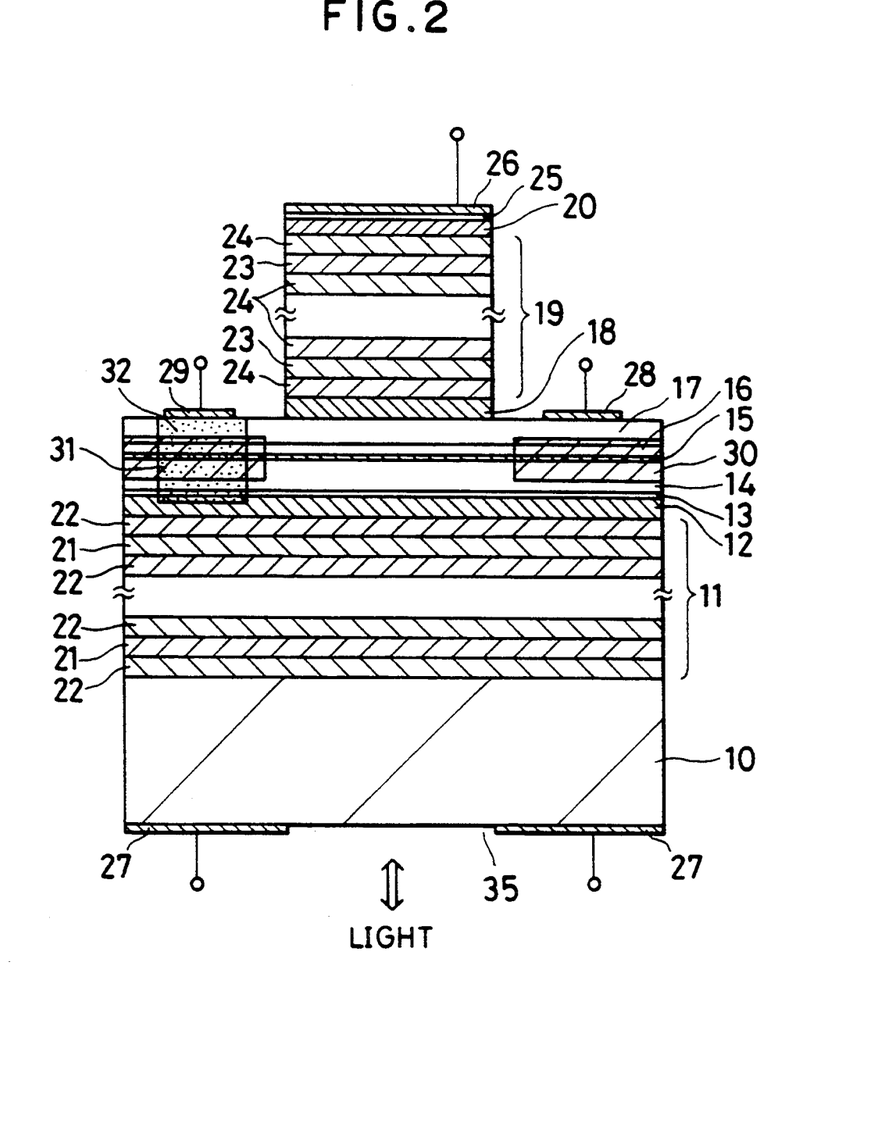
FIG. 2 is a cross-sectional view of a surface-normal optoelectronic device according to a first embodiment of this invention.

FIG. 2 cross-sectionally shows a surface-normal optoelectronic device according to a first embodiment of this invention. In FIG. 2, on an n-type GaAs substrate 10, an n-type semiconductor multilayer film 11 (doping concentration of donor $2\times10^{18}cm^{-3}$), an n-type AlGaAs layer 12 (doping concentration of donor $2\times10^{18}cm^{-3}$; layer thickness 1500 Å; Al composition ratio 0.4), a p-type AlGsAs layer 13 (doping concentration of acceptor $1\times10^{19}cm^{-3}$; layer thickness 50 Å; Al composition ratio 0.25), a non-doped AlGaAs layer 14 (layer thickness about 1000 Å; Al composition ratio 0.25), an active layer 15 having a quantum well structure having laminated non-doped InGaAs layers (In composition ratio 0.2) and non-doped AlGaAs layers (Al composition ratio 0.25) (layer thickness each 100 Å; three periods), a non-doped AlGaAs layer 16 (layer thickness about 1000 Å; Al composition ratio 0.25), an n-type AlGaAs layer 17 (doping concentration of donor $2\times10^{17}cm^{-3}$; layer thickness about 3000 Å; Al composition ratio 0.25) , a p-type AlGaAs layer 18 (doping concentration of acceptor $2\times10^{18}cm^{-3}$; layer thickness 1500 Å; Al composition ratio 0.4), a p-type semiconductor multilayer film 19 (doping concentration of acceptor $2\times10^{18}cm^{-3}$), and a p-type GaAs contact layer 20 (doping concentration of acceptor $1\times10^{19}$cm$^{-3}$) are laminatedly formed in this order. The p-type AlGaAs layer 18, p-type semiconductor multilayer film 19 and p-type GaAs contact layer 20 are formed in a mesa portion.

Referring to the ten layers thus formed on the substrate 10, the n-type semiconductor multilayer film 11 and n-type AlGaAs layer 12 constitute first semiconductor layers (a cathode region), and the p-type AlGaAs layer 13 constitutes a second semiconductor layer (p-type gate electrode). The non-doped AlGaAs layers 14 and 16 each serves to increase a gain of transistor action during the operation of the device. Referring to the active layer 15, the action as the active layer on a strict sense basis is provided by the non-doped InGaAs layers thereof, and on the other hand, the non-doped AlGaAs layers 14 and 16 do. The n-type AlGaAs layer 17 constitutes a third semiconductor layer (n-type gate region), and the p-type AlGaAs layer 18 and p-type semiconductor multilayer film 19 constitute fourth semiconductor layers (an anode region).

The p-type AlGaAs layer 13 (second semiconductor layer) and n-type AlGaAs layer 17 (third semiconductor layer) having the active layer 15 sandwiched therebetween are made larger in forbidden band width than the active layer 15. In addition, the forbidden band width of the p-type AlGaAs layer 13 is made smaller than that of the n-type AlGaAs layer 12 (part of the first semiconductor layers) adjacently formed to the layer 13. The forbidden band width of the n-type AlGaAs layer 17 is made smaller than that of the p-type AlGaAs layer 18 (part of the fourth semiconductor layers) adjacently formed to the layer 17. As a result, carriers and light can be easily confined thereto, so that laser emission can be made easily, leading to a reduction in threshold of luminescence.

The n-type semiconductor multilayer film 11 has n-type GaAs layers 21 (layer thickness about 672 Å) and n-type AlAs layer 22 (layer thickness about 804 Å) alternately laminated. Here, 24.5 pairs of the layers 21 and 22 are formed, in other words, 24 n-type AlAs layers 22 and 23 n-type GaAs layers 21 are formed in an alternate lamination manner. The p-type semiconductor multilayer film 19 has a p-type GaAs layer 23 (layer thickness about 672 Å) and a p-type AlAs layer 24 (layer thickness about 804 Å) alternately laminated. In this case, 15.5 pairs of the layers 23 and 24 are formed, in other words, 15 p-type AlAs layers 24 and 14 p-type GaAs layers 23 are formed in an alternate lamination manner. The layer thicknesses shown above correspond to the quarter-wavelengths of light in respective media (layers). The multilayer films 11 and 19 each serves to act as a reflecting film of light. The distance between the films 11 and 19 is preferable to be an integral multiple of the in-medium wavelength of emitted light in order to make emission easy. In this embodiment, the distance, from the center line of the active layer 15 to the multilayer film 19 is made two times the in-medium wavelength of emitted light, or about 5800 Å, and the distance from the center line of the active layer 15 to the multilayer film 11 is made equal to the in-medium wavelength thereof, or about 2900 Å.

On the p-type GaAs contact layer 20 of the mesa portion, an anode electrode consisting of a Cr layer 25 and an Au layer 26 is formed. On the lower surface of the substrate 10, that is, the surface thereof opposite to the surface on which the multilayer film 11 is formed, a cathode electrode made of an AuGeNi/Au layer 27 is formed excepting a window 35 formed at the center thereof for extracting light therefrom. The n-type AlGaAs layer 17 is exposed around the cylindrical mesa portion with a diameter of about 10 μm and, on the exposed surface of the n-type AlGaAs layer 17, an n-type gate electrode 28 made of an AuGeNi/Au layer and a p-type gate electrode 29 made of a Cr/Au layer are formed. The n-type gate electrode 28 and p-type gate electrode 29 are disposed on the opposite side to each other with respect to the mesa portion.

Within the n-type AlGaAs layer 17 (third semiconductor layer), non-doped AlGaAs layer 16, the active layer 15 an non-doped AlGaAs layer 14, as shown in FIG. 2, high resistance regions 30 and 31 are formed substantially just below the gate electrodes 28 and 29, respectively. The high resistance regions 30 and 31 are provided such that, in the direction perpendicular to the surface of the substrate 10, these regions extend to a portion within the n-type AlGaAs layer 17, that is in the vicinity of the active layer 15, extend through the entire thickness of the non-doped AlGaAs layer 16 and active layer 15, and extend partly into the non-doped AlGaAs layer 14, thus extending a portion of layer 14 on the side of the p-type AlGaAs layer 13 (second semiconductor layer). The section of the active layer 15 provided between the high resistance regions 30 and 31 constitutes a light-emitting region.

Within the n-type AlGaAs layer 17, non-doped AlGaAs layer 16, active layer 15, non-doped AlGaAs layer 14, p-type AlGaAs layer 13 and n-type AlGaAs layer 12, as shown in FIG. 2, a p-type diffusion region 32 having diffused zinc (Zn) atoms is formed passing through the high resistance region 31. The p-type diffusion region 32 constitutes a p-type gate region. The p-type diffusion region 32 is formed to be attained from the upper surface of the n-type AlGaAs layer 17 to the upper area of the n-type AlGaAs layer 12.

Next, a production method of the device shown above will be explained below.

Figure 3:
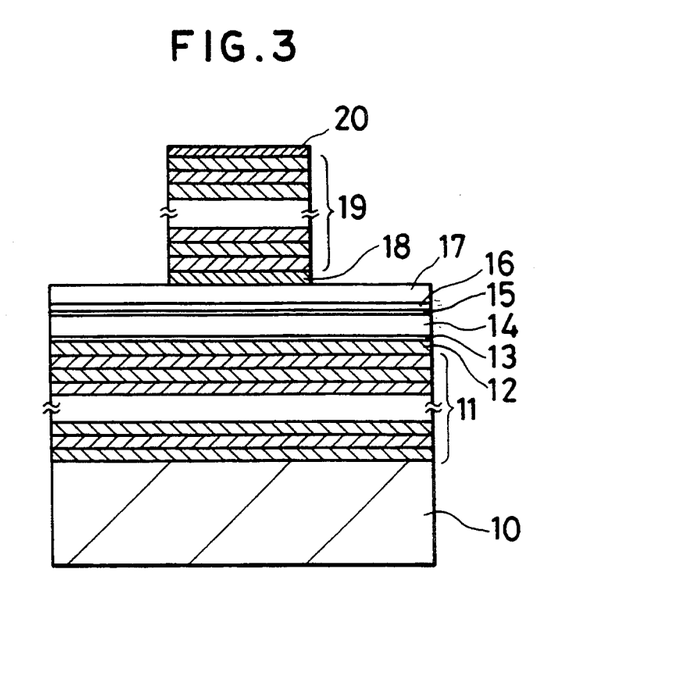
FIG. 3 cross-sectionally shows that a first semiconductor layer, a second semiconductor layer, an active layer, a third semiconductor layer, a fourth semiconductor layer and a contact layer are formed on a substrate in this order, and that a part of the fourth semiconductor layer and a part of the contact layer are removed thereafter to form a mesa portion thereon, FIG. 4 cross-sectionally shows that a Zn diffusion region is formed in the third semiconductor layer, and FIG. 5 cross-sectionally shows that high-resistance regions are formed in the third semiconductor layer.

First, by a molecular beam epitaxy (MBE) method, on the n-type GaAs substrate 10, the n-type semiconductor multilayer film 11, the n-type AlGaAs layer 12, the p-type AlGaAs layer 13, the non-doped AlGaAs layer 14, the active layer 15 of quantum well structure having the non-doped InGaAs layer and non-doped AlGaAs layers laminatedly formed, the non-doped AlGaAs layer 16, the n-type AlGaAs layer 17, the p-type AlGaAs layer 18, the p-type semiconductor multilayer film 19 and the p-type GaAs contact layer 20 are formed in this order by growing epitaxially.

Next, the p-type GaAs contact layer 20, p-type semiconductor multilayer film 19 and p-type AlGaAs layer 18 are subjected to mesa etching by a lithographic method to form a cylindrical mesa with a diameter of about 10 μm, which is shown in FIG. 3. In this case, however, a square pillar-shaped mesa of about 10 μm square may be formed instead of the cylindrical mesa.

Figure 4:
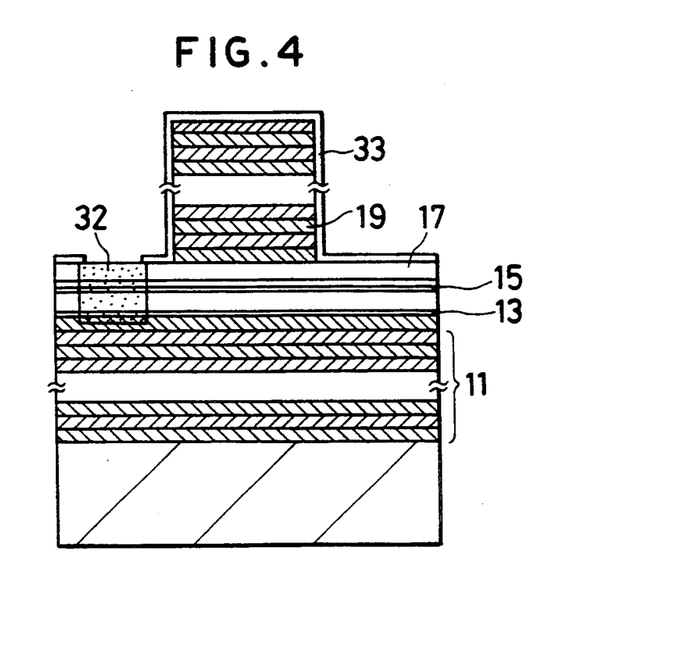

Next, as shown in FIG. 4, a SiO$_2$ film 33 with a thickness of about 0.3 μm is formed on the surface of the semiconductor multilayer lamination body forming the cylindrical mesa and then, an opening is formed in the SiO$_2$ film 33 at a predetermined position of the upper surface of the n-type AlGaAs layer 17. Thereafter, the diffusion of Zn atoms is carried out at 550° C. The Zn atoms are diffused in the lower direction passing through the opening to form the p-type diffusion region 32 as shown in FIG. 4. The diffusion should be carried out so that the diffusion front of the Zn atoms can pass through the p-type AlGaAs layer 13 as the p-type gate region. In this embodiment, the diffusion front is attained to the central portion of the n-type AlGaAs layer 12 formed beneath the p-type AlGaAs layer 13.

Figure 5:
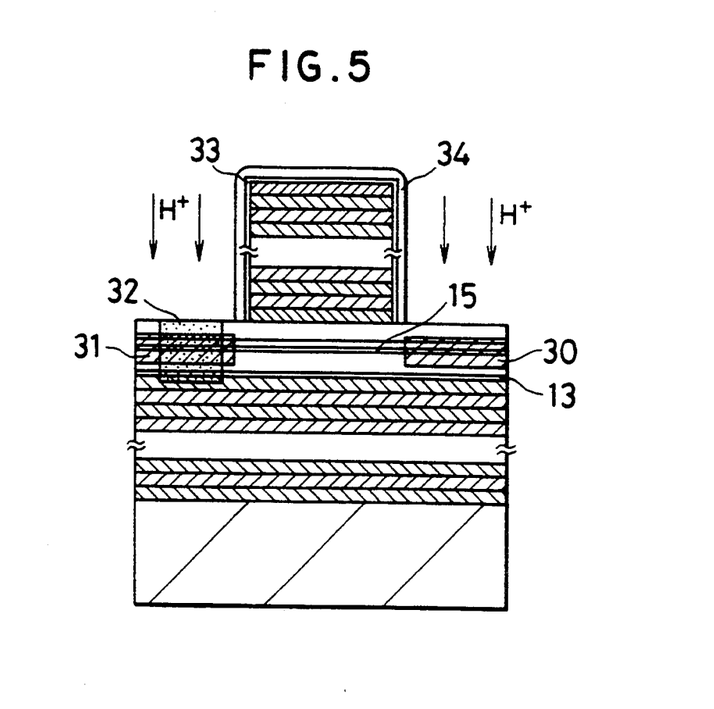

Next, a photoresist film (with a thickness of about 5 μm) is formed only on the cylindrical mesa of the semiconductor multilayer lamination body and then, the lithography technology is applied to remove the $SiO_2$ film 33 excepting that formed on the cylindrical mesa. As a result, on the cylindrical mesa, a mask consisting of the $SiO_2$ film 33 and a photoresist film 34 is formed as shown in FIG. 5. The photoresist film 34 is preferably hard-baked for one hour at about 200° C. Subsequently, irradiation of protons (H+) is made toward the mask to implant the protons thereto from the upper surface of the n-type AlGaAs layer 17 with no mask formed. As a result, the proton implantation is made so as to surround the cylindrical mesa to form an area where the protons are implanted. Such a region as is surrounded by the area becomes the light emitting region. The proton implantation is preferably carried out under the conditions of acceleration voltage 50 keV and dose $3 \times 10^{14} cm^{-2}$. As a result, as shown in FIG. 5, the high resistance regions 30 and 31 can be selectively formed only within the proton-implanted layers existing at a moderated depth. Accordingly, there can be formed the high resistance regions 30 and 31 at only the vicinity of the active layer 15. In addition, referring to the proton-implanted regions, the high resistance region 31 is formed inside the p-type diffusion region 32 and the high resistance region 30 is formed outside the same. After proton implantation, the mask is removed.

Then, the semiconductor multilayer lamination body is annealed for thirty seconds at 475° C. Thereafter, the layer 27 made of AuGeNi/Au is formed by the vacuum deposition technology on the lower surface of the substrate 10 except for at the window 35 for extracting light therefrom to make the cathode electrode. The Cr layer 25 and the Au layer 26 are laminated in this order by the vacuum deposition technology on the upper surface of the p-type GaAs contact layer 20 to make the anode electrode. Also, by the same technology, an AuGeNi/Au layer is formed at a predetermined position of the upper surface of the n-type AlGaAs layer 17 other than over the p-type diffusion region 32 to make the n-type gate electrode 28, and a Cr/Au layer is formed on the upper surface of the n-type AlGaAs layer 17 on the p-type diffusion region 32 to make the p-type gate electrode 29. As a result, the surface-normal optoelectronic device as shown in FIG. 2 can be obtained.

In case of using such a device as shown above, a bias voltage is applied so as to make the anode electrode positive and the cathode electrode negative, and the value of this bias voltage is set to the value just before the device is turned on. At this time, the gate electrodes 28 an 29 are not applied with a voltage. Under this condition, if light is sent from the window 35 formed on the lower surface of the substrate 10 into the device, it is turned on to emit light as illustrated. Once it is turned on, if the light is stopped being sent, the turn-on condition is maintained to continue the light emission. For turning it off, the polarity of a voltage to be applied to the anode and cathode electrodes is reversed and furthermore, voltages are applied to the n-type gate electrode 28 and p-type gate electrode 29 so as to make the electrode 28 positive and the electrode 29 negative, respectively. As a result, the carrier confined in the device is forcibly taken out of it at high speed, thereby turning it off.

The device according to the first embodiment of this invention advantageously features that high speed switching operations can be made while a current level necessary to emit light under turn-on condition being maintained low, and that from the fact that it is operable in the LD mode, a luminous efficiency can be improved, a light beam to be emitted is superior in directivity, and yet the compatibility to other devices and optical fibers is outstandingly high.

In this embodiment, an n-type contact layer may be formed between the substrate 10 and the n-type semiconductor multilayer film 11. Therefore, a cathode electrode can be formed on the n-type contact layer thus obtained, so that the electrodes become possible to be formed only on one side of a semiconductor wafer.

Second Embodiment

Figure 6:
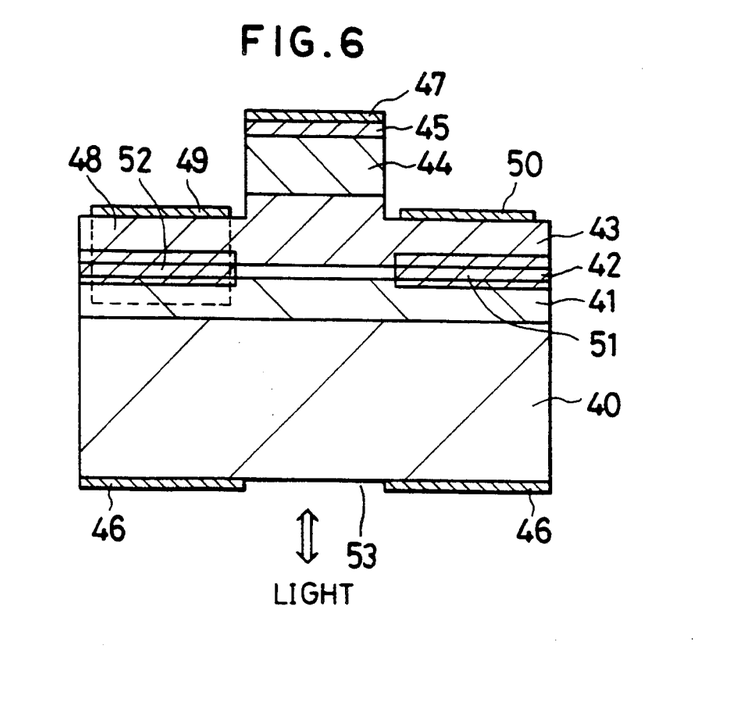
FIG. 6 is a cross-sectional view of a surface-normal optoelectronic device according to a second embodiment of this invention.

FIG. 6 is a cross-sectional view of a surface-normal optoelectronic device according to a second embodiment of this invention. In FIG. 6, an n-type AlGaAs layer 41 (Al composition ratio 0.4; layer thickness 1 μm; doping concentration of donor $1 \times 10^{18} cm^{-3}$), a p-type GaAs layer 42 (layer thickness 50 Å; doping concentration of acceptor $1 \times 10^{19} cm^{-3}$), an n-type GaAs layer 43 (layer thickness 1 μm; doping concentration of donor $1 \times 10^{17} cm^{-3}$), a p-type AlGaAs layer 44 (Al composition ratio 0.4; layer thickness 0.5 μm; doping concentration of acceptor $1 \times 10^{18} cm^{-3}$) and a p-type GaAs layer 45 (layer thickness 0.2 μm; doping concentration of acceptor $1 \times 10^{19} cm^{-3}$) are laminatedly formed in this order on an n-type GaAs substrate 40. An active layer as in the first embodiment is not formed in this embodiment. The n-type AlGaAs layer 41 constitutes a first semiconductor layer, the p-type GaAs layer 42 constitutes a second semiconductor layer, the n-type GaAs layer 43 constitutes a third semiconductor layer, and the p-type AlGaAs layer 44 constitutes a fourth semiconductor layer. The p-type GaAs layer 45 is a contact layer. The layers 41, 42, 43, 44 and 45 can be successively formed on the substrate 40 by growing epitaxially by a molecular beam epitaxy (MBE) method as in the first embodiment.

On the upper surface of the p-type GaAs contact layer 45 in a mesa portion, an anode electrode 47 is provided, and on the lower surface of the substrate 10, a cathode electrode 46 is provided excepting a window 53 formed at the center thereof for taking out light therefrom. The n-type GaAs layer 43 has the surface exposed around the mesa portion thereby to form an n-type gate electrode 50 and a p-type gate electrode 49 thereon. The n-type gate electrode 50 and p-type gate electrode 49 are disposed on the opposite side to each other with respect to the mesa portion.

Within the n-type GaAs layer 43 (third semiconductor layer), p-type GaAs layer 42 (second semiconductor layer) and n-type AlGaAs layer 41 (first semiconductor layer), as shown in FIG. 6, two high resistance regions 51 and 52 are formed substantially just below the gate electrodes 49 and 50, respectively. The high resistance regions 51 and 52 respectively include, in the vertical direction (layer thickness direction), the total thickness of the p-type GaAs layer 42, and the vicinal thickness ranges of the n-type GaAs layer 43 and n-type AlGaAs layer 41 to the p-type GaAs layer 42. That is, the regions 51 and 52 are not formed in the range below the vicinal thickness range of the n-type AlGaAs layer 41 and in the range above the vicinal thickness range of the n-type GaAs layer 43. The section of the p-type GaAs layer 42 provided between the high resistance regions 51 and 52 becomes a light emitting region.

A p-type diffusion region 48 is formed vertically passing through the high resistance region 52 within the n-type GaAs layer 43, p-type GaAs layer 42 and n-type AlGaAs layer 41 as shown in FIG. 6, which constitutes a p-type gate region. The p-type diffusion region 48 is attained from the upper surface of the n-type GaAs layer 43 to the vicinity of the center of the n-type Al-GaAs layer 41.

The electrodes 46, 47, 49 and 50, high resistance regions 51 and 52, and p-type diffusion region 48 may be formed by the same method as is used in the first embodiment.

The p-type GaAs layer 42 and n-type GaAs layer 43 are larger in forbidden band width than the n-type AlGaAs layer 41 and/or p-type AlGaAs layer 44, and the carriers are confined in the p-type GaAs layer 42 and n-type GaAs layer 43 under the turn-on condition, resulting in an improvement in luminous efficiency. As a result, the threshold of luminescence can be reduced.

The device of this embodiment has a mesa portion as in the first embodiment, which is different therefrom in that the mesa etching is made as to etch the n-type GaAs layer 43 as the third semiconductor layer up to a moderate depth thereby to have the n-type GaAs layer 43 existing at the root of the mesa portion. In addition, the device of this embodiment is different from that of the preceding embodiment in that the high resistance regions 51 and 52 formed by an ion implantation method respectively are provided at the vicinity of the junction of the p-type GaAs layer 42 and n-type GaAs layer 43, and there exists no active layer as formed in the preceding embodiment.

A method of using the device of this embodiment is the same as in the first embodiment. That is, if it is to be turned on, no voltage is applied to the gate electrodes 49 and 50, but a voltage is applied so as to make the anode electrode 47 positive and the cathode electrode 46 negative, and under this condition, light is sent from the window 53 formed on the lower surface of the substrate 40 thereunto. Thus, light is emitted from the window 53 on the lower surface of the substrate 40. If it is to be turned off, the polarity of a voltage to be applied to the anode electrode 47 and cathode electrode 46 is reversed, and a voltage is applied thereto so as to make the p-type gate electrode 29 negative and the n-type gate electrode 28 positive.

As explained above, the surface-normal optoelectronic device of this invention can be switched at higher speed as well as can provide a good luminous efficiency as compared with conventional ones.

What is claimed is:

1. A semiconductor surface-normal optoelectronic device, comprising:
    a semiconductor substrate;
    a first semiconductor region of a first electroconductive type formed on said substrate;
    a second semiconductor region of a second electroconductive type having a polarity opposite to that of the first electroconductive type, which is formed on said first semiconductor region;
    a semiconductor active layer formed on said second semiconductor region;
    a third semiconductor region of the first electroconductive type formed on said semiconductor active layer;
    a fourth semiconductor region of the second electroconductive type formed on said third semiconductor region;
    a cathode electrode connected to one of said first semiconductor region and said fourth semiconductor region;
    an anode electrode connected to the other of said first semiconductor region and said fourth semiconductor region;
    a first gate electrode connected to said second semiconductor region;
    a second gate electrode connected to said third semiconductor region; and
    a high electric resistance region that passes through said active layer, that surrounds a light emitting region of said active layer, and that has an electric resistance higher than that of the light emitting region;
    whereby an electric current flowing through said active layer is restricted by said high electric resistance region.

2. A semiconductor surface-normal optoelectronic device as claimed in claim 1, wherein
    a window is provided on a face of said semiconductor substrate opposing said first semiconductor region, such that light is emitted and received through said window.

3. A semiconductor surface-normal optoelectronic device as claimed in claim 2, wherein
    when a voltage is applied between said anode electrode and said cathode electrode, light is emitted through said window by incident light received through said window, and said device continues emitting light even after the incident light is no longer received, and
    when reverse polarity voltages are applied to said first gate electrode and said second gate electrode, respectively, emission of the light from said window terminates.

4. A semiconductor surface-normal optoelectronic device as claimed in claim 3, wherein
    said second and third semiconductor regions are larger in forbidden band width than said semiconductor active layer,
    said second semiconductor region is smaller in forbidden band width than at least one part of said first semiconductor region, the one part being in contact with said second semiconductor region, and
    said third semiconductor region is smaller in forbidden band width than at least one part of said fourth semiconductor region, the one part of said fourth semiconductor region being in contact with said third semiconductor region.

5. A semiconductor surface-normal optoelectronic device as claimed in claim 4, wherein
    said first semiconductor region includes a layer serving as a reflecting mirror, and said fourth semiconductor region includes a layer serving as a reflecting mirror,
    whereby a laser action is effected utilizing the reflecting mirrors.

6. A semiconductor surface-normal optoelectronic device as claimed in claim 5, wherein said layers serving as the reflecting mirrors are multilayer films, respectively.

7. A semiconductor surface-normal optoelectronic device as claimed in claim 6, wherein
a total thickness of said second semiconductor region, said semiconductor active region and said third semiconductor region is substantially equal to an integral multiple of an in-medium wavelength of light emitted from the light emitting region.

8. A semiconductor surface-normal optoelectronic device as claimed in claim 7, wherein
said active layer has a quantum well structure in which a first semiconductor layer has a light-emitting function and a second semiconductor layer has a function of raising a gain of transistor action.

9. A semiconductor surface-normal optoelectronic device as claimed in claim 8, further comprising:
a mesa portion, wherein said fourth semiconductor region is formed in said mesa portion, and said high resistance region is formed around said mesa portion.

10. A semiconductor surface-normal optoelectronic device as claimed in claim 9, wherein
said high resistance region extends at least into one of said second semiconductor region and said third semiconductor region.

11. A semiconductor surface-normal optoelectronic device as claimed in claim 10, wherein
said high resistance region is selectively formed by an ion-implantation technique.

12. A semiconductor surface-normal optoelectronic device as claimed in claim 1, wherein,
when a voltage is applied between said anode electrode and said cathode electrode, light is emitted through a window formed on a face of said semiconductor substrate opposing said first semiconductor region by incident light received through said window, and said device continues emitting light even after the incident light is no longer received, and
when reverse polarity voltages are applied to said first gate electrode and said second gate electrode, respectively, emission of the light from said window terminates.

13. A semiconductor surface-normal optoelectronic device as claimed in claim 1, wherein
said first semiconductor region includes a layer serving as a reflecting mirror, and said fourth semiconductor region includes a layer serving as a reflecting mirror,
whereby a laser action is effected utilizing the reflecting mirrors.

14. A semiconductor surface-normal optoelectronic device as claimed in claim 1, wherein
a total thickness of said second semiconductor region, said semiconductor active region and said third semiconductor region is substantially equal to an integral multiple of an in-medium wavelength of light emitted from the light emitting region.

15. A semiconductor surface-normal optoelectronic device comprising:
a semiconductor substrate;
a first semiconductor layer of a first electroconductive type formed on said substrate;
a second semiconductor layer of a second electroconductive type having a polarity opposite to that of the first electroconductive type, which is formed on said first semiconductor layer;
a third semiconductor layer of the first electroconductive type formed on said second semiconductor layer;
a fourth semiconductor layer of the second electroconductive type formed on said third semiconductor layer;
a cathode electrode connected to one of said first semiconductor layer and said fourth semiconductor layer;
an anode electrode connected to the other of said first semiconductor layer and said fourth semiconductor layer;
a first gate electrode connected to said second semiconductor layer;
a second gate electrode connected to said third semiconductor layer; and
a high electric resistance region that is formed in a vicinity of a junction of said second and third semiconductor layers, that surrounds a light emitting region, and that has an electric resistance higher than that of the light emitting region;
whereby an electric current flowing through said light emitting region is restricted by the high electric resistance region.

16. A semiconductor surface-normal optoelectronic device as claimed in claim 15, wherein
a window is provided on a face of said semiconductor substrate opposing said first semiconductor layer, such that light is emitted and received through said window.

17. A semiconductor surface-normal optoelectronic device as claimed in claim 16, wherein
when a voltage is applied between said anode electrode and said cathode electrode, light is emitted through said window by incident light received through said window, and said device continues emitting light even after the incident light is no longer received, and
when reverse polarity voltages are applied to said first gate electrode and said second gate electrode, respectively, emission of the light from said window terminates.

18. A semiconductor surface-normal optoelectronic device as claimed in claim 17, wherein
said second and third semiconductor layers are larger in forbidden band width than at least one of said first semiconductor layer and said second semiconductor layer.

19. A semiconductor surface-normal optoelectronic device as claimed in claim 18, further comprising:
a mesa portion, wherein an entirety of said fourth semiconductor layer and a portion of said third semiconductor layer are formed in said mesa portion, and said high resistance region is formed around said mesa portion.

20. A semiconductor surface-normal optoelectronic device as claimed in claim 19, wherein
said high resistance region extends to said first semiconductor layer and said third semiconductor layer.

21. A semiconductor surface-normal optoelectronic device as claimed in claim 20, wherein
said high resistance region is selectively formed by an ion-implantation technique.

* * * * *

UNITED STATES PATENT AND TRADEMARK OFFICE
CERTIFICATE OF CORRECTION

PATENT NO. : 5,340,998
DATED : August 23, 1994
INVENTOR(S) : Kenichi Kasahara

It is certified that error appears in the above-indentified patent and that said Letters Patent is hereby corrected as shown below:

Col. 5, line 17, before "14 and 16" insert --thereof have the same action as each of the non-doped AlGaAs layers--;

Col. 6, line 23, delete "extending" and insert --excluding--;

Col. 7, line 14, delete "H+" and insert --$H^+$).

Signed and Sealed this

Tenth Day of January, 1995

BRUCE LEHMAN

Attest:

Attesting Officer     Commissioner of Patents and Trademarks